United States Patent
Takahashi et al.

(10) Patent No.: US 7,173,681 B2
(45) Date of Patent: Feb. 6, 2007

(54) TWO PIXEL ELECTRODES INTERPOSING THE SIGNAL LINE EXTENDING INTO WITHOUT EXTENDING BEYOND THE RECESS ON THE PROTECTION FILM CAUSED BY THE CONTACT HOLE

(75) Inventors: Hideyuki Takahashi, Fukaya (JP); Kohei Nagayama, Sagamihara (JP); Mamoru Furuta, Fukaya (JP); Shinichi Kawamura, Tokyo (JP); Toshihiro Ninomiya, Fukaya (JP); Koji Soma, Tokyo (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 7 days.

(21) Appl. No.: 10/770,409

(22) Filed: Feb. 4, 2004

(65) Prior Publication Data

US 2004/0160543 A1     Aug. 19, 2004

(30) Foreign Application Priority Data

Feb. 17, 2003   (JP)   ............................. 2003-038572

(51) Int. Cl.
*G02F 1/13333* (2006.01)
(52) U.S. Cl. ..................... 349/138; 349/47; 349/187
(58) Field of Classification Search ................ 349/43, 349/138, 23, 38, 39, 114, 47, 187; 257/59, 257/72
See application file for complete search history.

(56) References Cited

U.S. PATENT DOCUMENTS

| | | | | |
|---|---|---|---|---|
| 5,614,730 A | * | 3/1997 | Nakazawa et al. | 257/59 |
| 5,995,174 A | * | 11/1999 | Ukita | 349/43 |
| 6,249,327 B1 | * | 6/2001 | Murade et al. | 349/43 |
| 2002/0071072 A1 | * | 6/2002 | Ohtani et al. | 349/110 |

FOREIGN PATENT DOCUMENTS

| | | |
|---|---|---|
| JP | 2001-188253 | 7/2001 |
| JP | 2002-14373 | 1/2002 |
| JP | 2002-296619 | 10/2002 |

* cited by examiner

*Primary Examiner*—Andrew Schechter
*Assistant Examiner*—Lucy Chien
(74) *Attorney, Agent, or Firm*—Oblon, Spivak, McClelland, Maier & Neustadt, P.C.

(57) ABSTRACT

In an electrode substrate used in a liquid crystal display device, a contact hole for connecting a signal line to a drain electrode of a pixel thin film transistor is provided in a position overlapping a pixel electrode in order to improve yields by reducing a short circuit between adjacent pixel electrodes. With this configuration, the contact hole does not exist at a boundary between the two adjacent pixel electrodes. Accordingly, the pixel electrodes do not suffer an influence of an electrode material remaining at a recess of the contact hole, and a short circuit between the adjacent pixel electrodes can be thereby prevented.

1 Claim, 9 Drawing Sheets

TWO PIXEL ELECTRODES INTERPOSING THE SIGNAL LINE EXTENDING INTO WITHOUT EXTENDING BEYOND THE RECESS ON THE PROTECTION FILM CAUSED BY THE CONTACT HOLE

CROSS-REFERENCE TO RELATED APPLICATIONS

This application is based upon and claims the benefit of priority from Japanese Patent Application No. 2003-38572 filed Feb. 17, 2003; the entire contents of which are incorporated herein by reference.

BACKGROUND OF THE INVENTION

1. Field of the Invention

The present invention relates to an electrode substrate for a display device, more specifically, to a structure of an array substrate used in an active matrix liquid crystal display device.

2. Description of the Related Art

In recent years, active matrix liquid crystal display devices are becoming mainstream in the field of flat display devices due to reasons including high contrast with small crosstalk, capability of transmissive display and large-screen display, and the like. A liquid crystal display device known of this type is disclosed in Japanese Unexamined Patent Publication No. 2002-296619.

FIG. 1 is a plan view showing a schematic configuration of a pixel in a conventional liquid crystal display device. Meanwhile, FIG. 2 is a cross-sectional view taken along the I—I—I line in FIG. 1, and FIG. 3 is a cross-sectional view taken along the II—II line in FIG. 1.

The liquid crystal display device includes an array substrate 100 and a counter substrate 200 which are disposed to face each other, while a liquid crystal layer 300 is formed in a space between the both substrates.

The array substrate 100 includes scan lines 102, auxiliary capacitor lines 130 disposed in planarly parallel to the scan lines 102 on the same plane, and signal lines 101 disposed in planarly perpendicular to the scan lines 102 and the auxiliary capacitor lines 130 through an insulating film 160, all of which are formed on a glass substrate 105.

A pixel TFT 110 is formed at an intersection of the signal line 101 and the scan line 102 as a pixel switching element. A protection film 170 is formed on a surface of this pixel TFT 110. Moreover, a color filter 180 and a pixel electrode 120 are formed in a region surrounded by the signal lines 101 and the auxiliary capacitor lines 130 (the region indicated by bold lines in FIG. 1). The pixel TFT 110 includes a semiconductor layer 111, a gate electrode 112 connected to the scan line 102, a drain electrode 113 connected to the signal line 101, and a source electrode 114 connected to the pixel electrode 120.

Here, reference numeral 140 in FIG. 2 denotes an outgoing line connecting the drain electrode 113 of the pixel TFT 110 and the pixel electrode 120, reference numeral 150 denotes a gate insulating film, and reference numeral 190 denotes an alignment film formed on a surface of the pixel electrode 120. A polarizing plate 195 is attached to outside of the glass substrate 105.

The counter substrate 200 includes a counter electrode 210 and an alignment film 230 which are sequentially formed on a glass substrate 220. Moreover, a polarizing plate 240 is attached to outside of the glass substrate 220.

As shown in FIG. 2 and FIG. 3, the signal line 101 for supplying a video signal and the drain electrode 113 of the pixel TFT 110 are connected to each other through a contact hole 115 which is provided so as to penetrate the insulating film 160 and the gate insulating film 150. Conventionally, the contact hole 115 has been disposed between adjacent pixel electrodes 120, and respective ends of the adjacent pixel electrodes 120 have been separated by a constant dimension at aperture portions of the contact hole 115.

However, in the array substrate 100 of the above-described configuration, a horizontal dimension A from a bottom of the contact hole 115 to the end of the pixel electrode 120 may become shorter than a horizontal dimension B of a tapered portion of the contact hole 115 because of manufacturing errors when forming the pixel electrode. In this case, an electrode material such as ITO tends to remain at recessed portions of the contact hole 115 indicated by arrows in FIG. 3 when forming the pixel electrodes 120. Accordingly, there has been a risk of a short circuit between the adjacent pixel electrodes 120 attributable to the remaining electrode material. When the adjacent pixel electrodes 120 are short-circuited as described above, the pixels turn out to be defective pixels because of incapability of retaining original write voltages. Accordingly, such a short circuit would constitute a problem of reduction in yields.

An object of the present invention is to provide an electrode substrate for a display device which can achieve fabrication of liquid crystal display devices at high yields by reducing short circuits between adjacent pixel electrodes.

SUMMARY OF THE INVENTION

An electrode substrate for a display device of the first invention comprises a plurality of scan lines and a plurality of signal lines which are disposed so as to intersect one another, a plurality of pixel electrodes disposed at respective intersections, switching elements provided at the respective intersections, each of the switching elements being configured to allow conduction between the signal line and the pixel electrode by an instruction of a gate signal to be supplied to the scan line and thereby to write a video signal supplied to the signal line into the pixel electrode, and contact holes provided in each position overlapping each of the pixel electrodes, each of the contact holes being configured to connect the signal line and one electrode of the switching element.

The second invention is a electrode substrate for a display device wherein an end of one of the two pixel electrodes which are adjacent to each other while interposing the signal line is provided in a position overlapping part of the contact hole, an end of the other one of the two pixel electrodes is distant from an aperture edge of the contact hole by a longer dimension than a horizontal dimension of a tapered portion of the contact hole.

An electrode substrate for a display device of the third invention comprises a plurality of scan lines and a plurality of signal lines which are disposed so as to intersect one another, a plurality of pixel electrodes disposed at respective intersections, switching elements provided at the respective intersections, each of the switching elements being configured to allow conduction between the signal line and the pixel electrode by an instruction of a gate signal to be supplied to the scan line and thereby to write a video signal supplied to the signal line into the pixel electrode, and contact holes provided in each position overlapping each of the signal lines, each of the contact holes being configured to connect the signal line and one electrode of the switching element wherein respective ends of the two pixel electrodes, being adjacent to each other while interposing the signal line, are distant from aperture edges of the contact holes severally by a dimension longer than a horizontal dimension of a tapered portion of the contact hole.

DESCRIPTION OF THE EMBODIMENTS

First Embodiment

Figure 1:
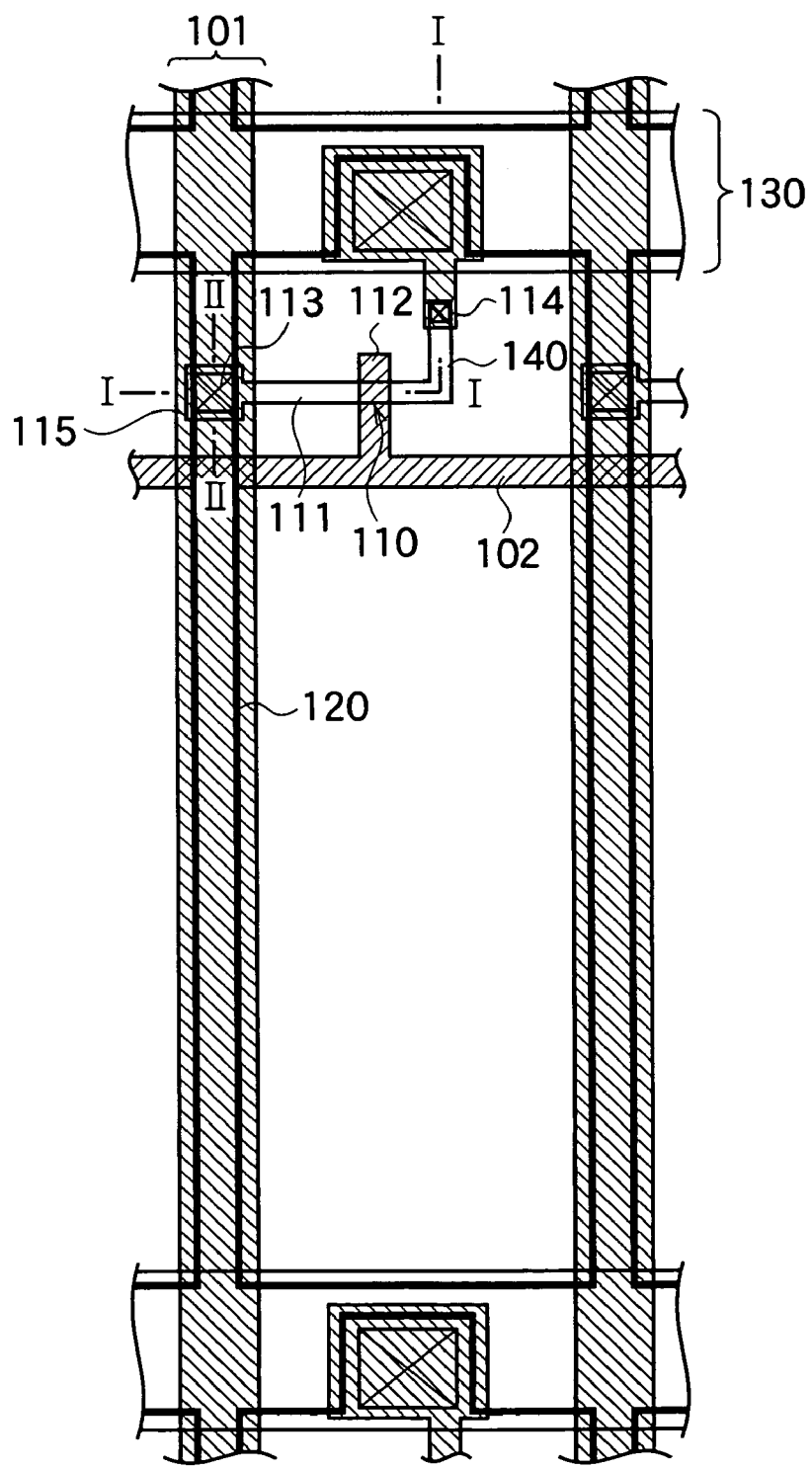
FIG. 1 is a plan view showing a schematic configuration of a pixel in a conventional liquid crystal display device.
Figure 2:
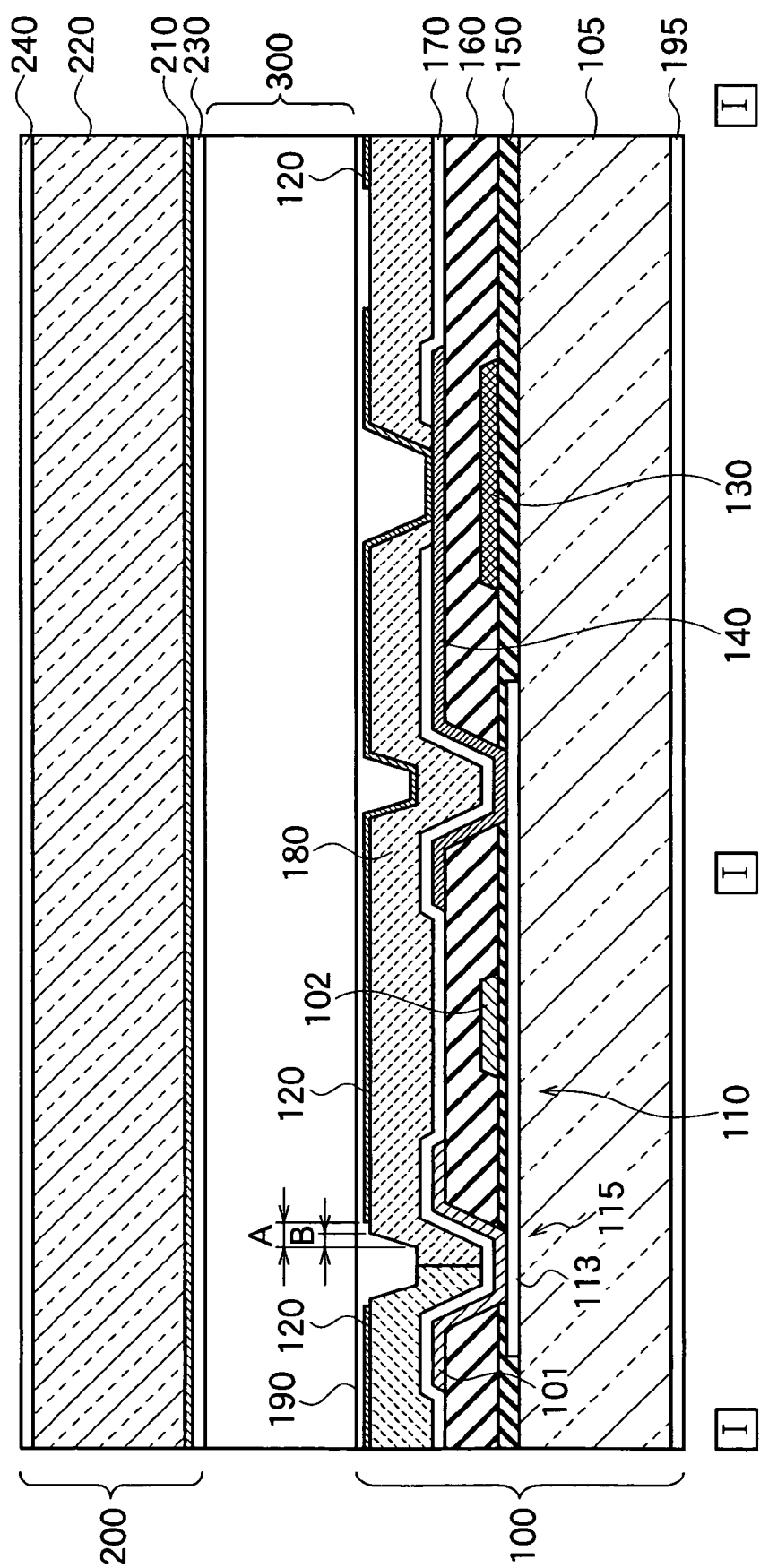
FIG. 2 is a cross-sectional view showing the schematic configuration, which is taken along the I—I—I line in FIG. 1.
Figure 3:
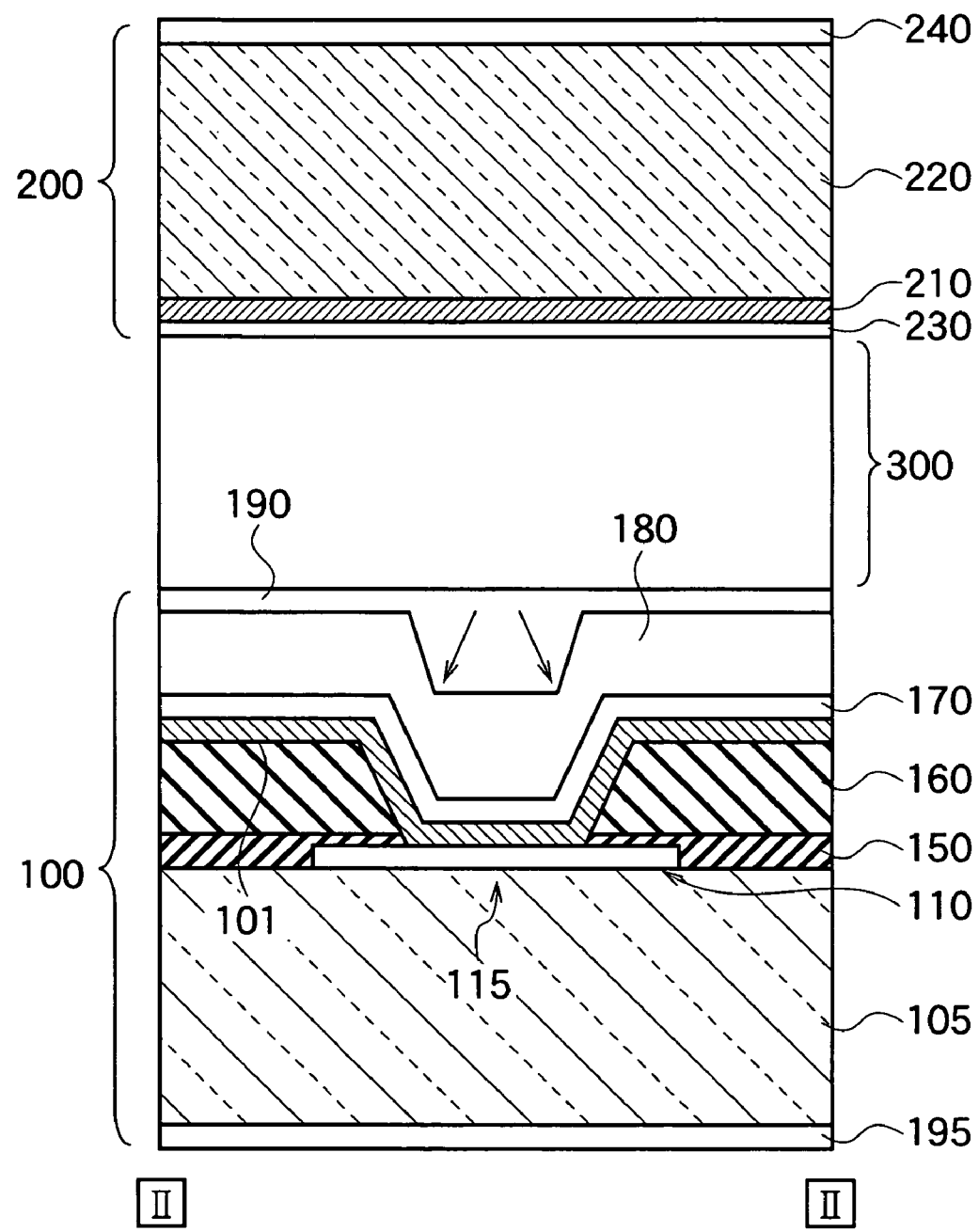
FIG. 3 is a cross-sectional view showing the schematic configuration, which is taken along the II—II line in FIG. 1.

Now, description will be made on a case of applying an electrode substrate according to a first embodiment to a liquid crystal display device. Here, in the respective drawings, elements equivalent to those illustrated in FIG. 1 to FIG. 3 are denoted by the same reference numerals.

Figure 4:
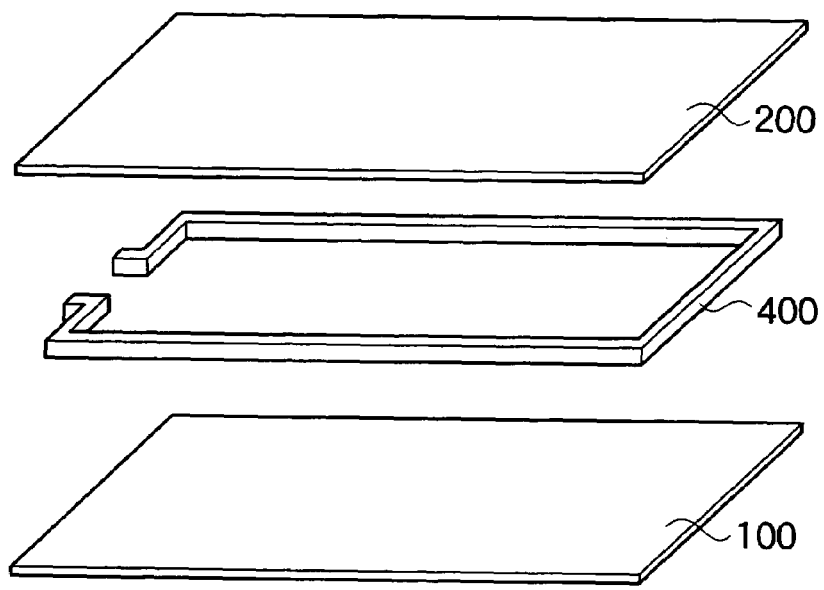
FIG. 4 is a perspective assembly view showing a configuration of a liquid crystal display device according to a first embodiment.

As shown in FIG. 4, this liquid crystal display device adopts a configuration in which an array substrate 100 and a counter substrate 200 are disposed opposite to each other, peripheries of the both substrates are sealed with a sealing member 400, and a liquid crystal layer is formed in a space between the array substrate 100 and the counter substrate 200 by filling a liquid crystal material therein from an inlet formed on the sealing member 400. In this embodiment, the array substrate 100 corresponds to the electrode substrate.

Figure 5:
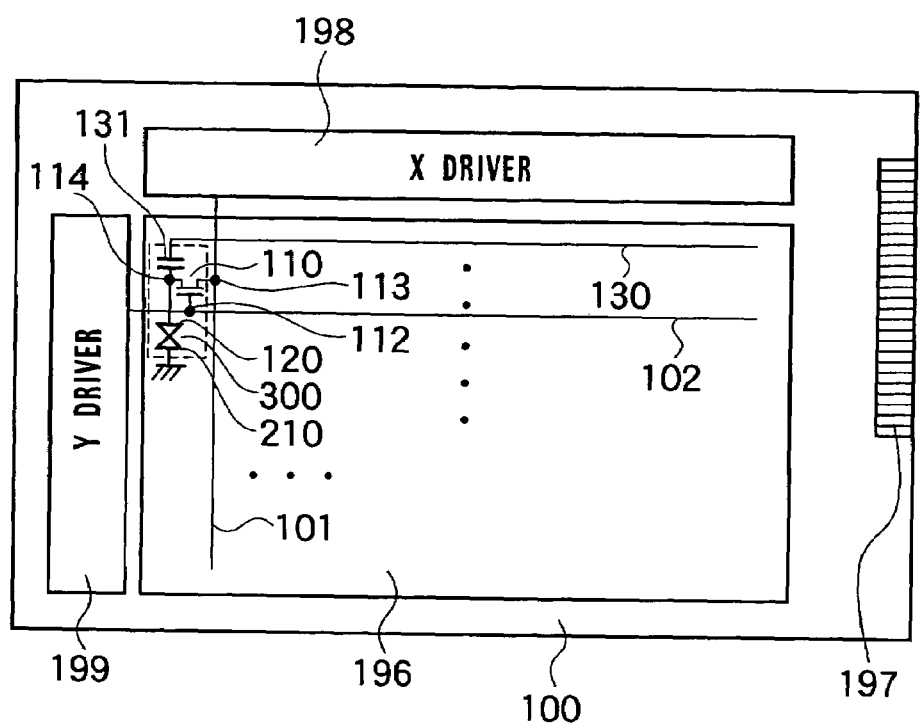
FIG. 5 is a plan view showing a schematic configuration of an array substrate according to the first embodiment.

As shown in FIG. 5, on the array substrate 100, there are formed a pixel area 196 constituting a display region, an OLB pad 197 for inputting video signals, control signals, and the like from outside, an X driver (a signal line drive circuit) 198 for supplying the video signals to signal lines 101, and a Y driver (a scan line drive circuit) 199 for supplying gate signals to scan lines 102.

A plurality of signal lines 101 and a plurality of scan lines 102 are arranged in a matrix fashion in the pixel area 196 so as to intersect one another, and auxiliary capacitor lines 130 are arranged in parallel to the scan lines 102. Moreover, a pixel TFT 110 as a switching element, and a pixel electrode 120 corresponding to the pixel TFT 110 are disposed on each intersection. An area surrounded by broken lines in FIG. 5 corresponds to one pixel. Note that FIG. 5 illustrates only one signal line 101 and one scan line 102 for convenience.

A gate electrode 112 which is a control electrode of the pixel TFT 110 is connected to scan line 102 in each row, and a drain electrode 113 which is one of main electrodes is connected to the signal line 101 in each column. Moreover, a source electrode 114 which is the other main electrode is connected to the pixel electrode 120 and an auxiliary capacitor element 131. The auxiliary capacitor element 131 forms an auxiliary capacitor (Cs) between the pixel electrode 120 and the auxiliary capacitor line 130. Moreover, a given auxiliary capacitor voltage is supplied from an unillustrated external circuit to the auxiliary capacitor line 130.

In the meantime, a counter electrode which is electrically opposed to the pixel electrode 120 is disposed on the counter substrate 200 side. A counter voltage is supplied from an unillustrated external circuit to this counter electrode.

Here, switching elements of the pixel TFTs 110, of the X driver 198, and of the Y driver 199 are made of polysilicon TFTs which are formed on the array substrate 100 in the same process.

Figure 6:
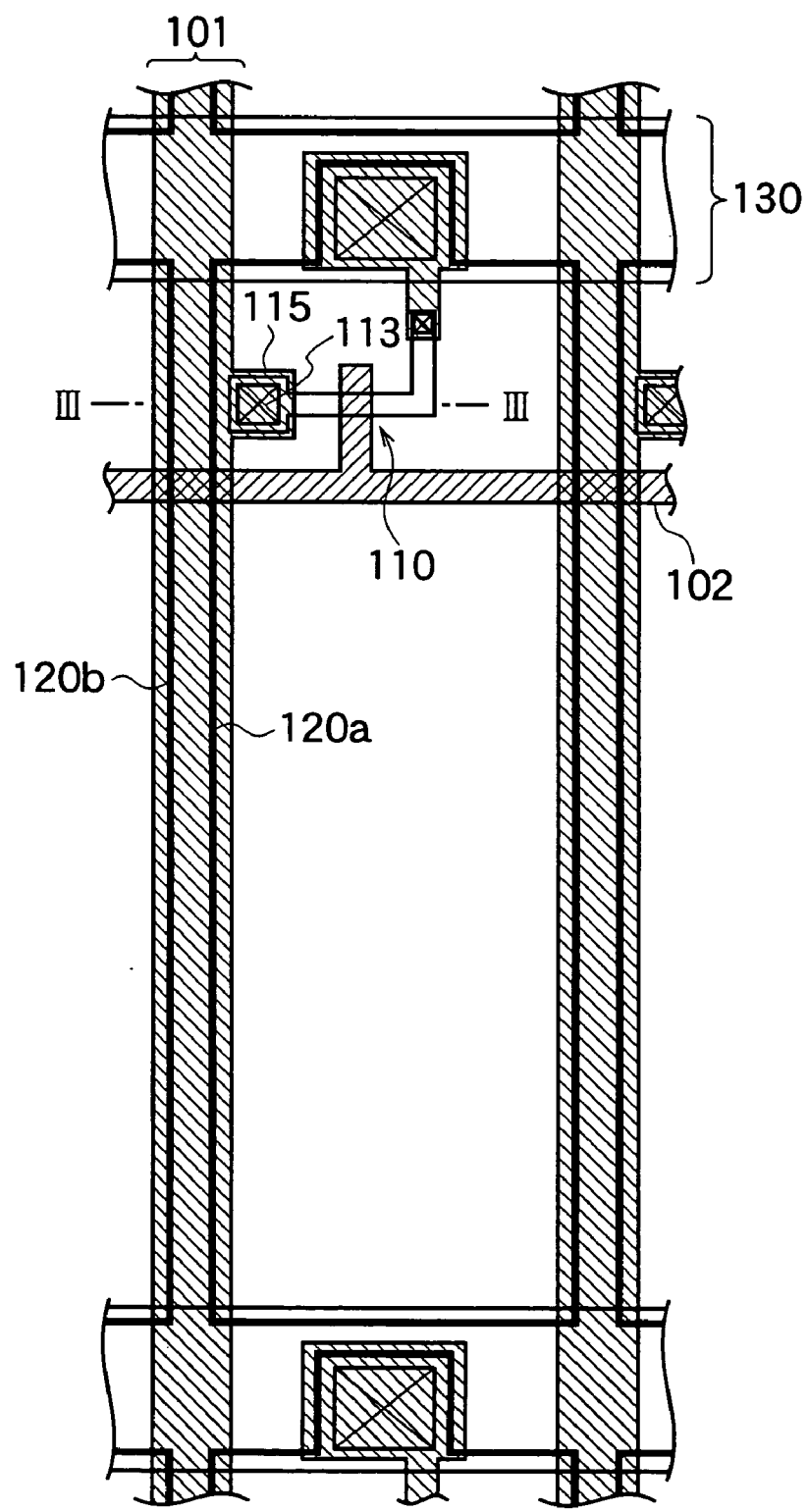
FIG. 6 is a plan view showing a schematic configuration of each pixel in the liquid crystal display device according to the first embodiment.

Next a structure of a pixel on the array substrate 100 of the above-described configuration will be described. As shown in FIG. 6, in this embodiment, a contact hole 115 for connecting the signal line 101 and the drain electrode 113 of the pixel TFT 110 is provided in a position overlapping a pixel electrode 120a.

Figure 7:
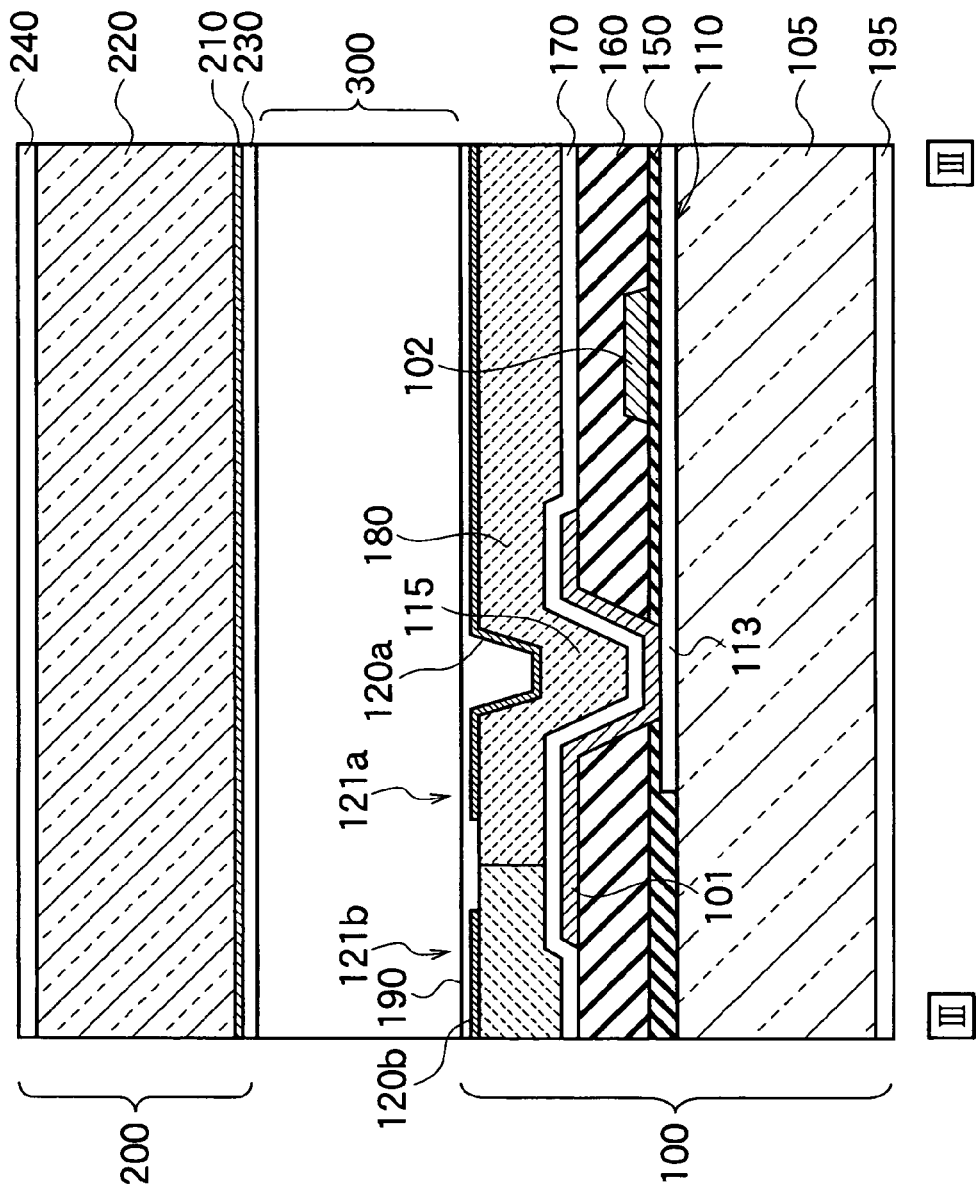
FIG. 7 is a cross-sectional view showing the schematic configuration, which is taken along the III—III line in FIG. 6.

To be more precise, as shown in FIG. 7, the contact hole 115 is provided so as to penetrate an insulating film 160 and a gate insulating film 150, and the signal line 101 is connected to the drain electrode 113 through this contact hole 115. The signal line 101 is recessed at a portion corresponding to the contact hole 115.

A protection film 170 is formed on the signal line 101, and a color filter 180 is formed thereon. The pixel electrode 120a is formed on the color filter 180 so as to overlap the position recessed by the contact hole 115.

A space between the pixel electrode 120a and a pixel electrode 120b is separated by a given dimension at a flat portion on the color filter 180. Note that the two adjacent pixel electrodes 120 disposed on both sides of the signal line 101 are denoted as the pixel electrodes 120a and 120b for convenience of explanation.

Next, an operation of this liquid crystal display device will be briefly described. When the gate signal is supplied from the Y driver 199 to each of the scan lines 102, the pixel TFT 110 connected to the relevant scan line 102 is turned on and the source and drain thereof are conducted so as to allow writing of the video signal. When the video signal is supplied from the X driver 198 to each of the signal lines 101 synchronously with the gate signal, the video signal is written in the pixel electrode 120 at the timing when the source and drain of the pixel TFT 110 are conducted. This video signal is retained between the pixel electrode 120 and the counter electrode 210 as a signal voltage. During this period, a liquid crystal layer 300 reacts in response to the magnitude of the signal voltage, and an amount of transmission of unillustrated backlight is controlled for each pixel. Such an operation is executed for all the pixels within one-frame period, and a transmitted image for one screen shot is thereby displayed.

Therefore, according to this embodiment, the contact hole 115 does not exist at a boundary between the adjacent pixel electrodes 120a and 120b, and respective ends 121a and 121b of the pixel electrodes 120a and 120b are formed separately at the flat portions of the color filters 180 with a given dimension. In this way, even if the positions of the pixel electrodes 120 are shifted due to manufacturing errors when forming the pixel electrodes, it is possible to prevent the adjacent pixel electrodes from constituting a short circuit attributable to an electrode material remaining at the recess of the contract hole 115.

Second Embodiment

Figure 8:
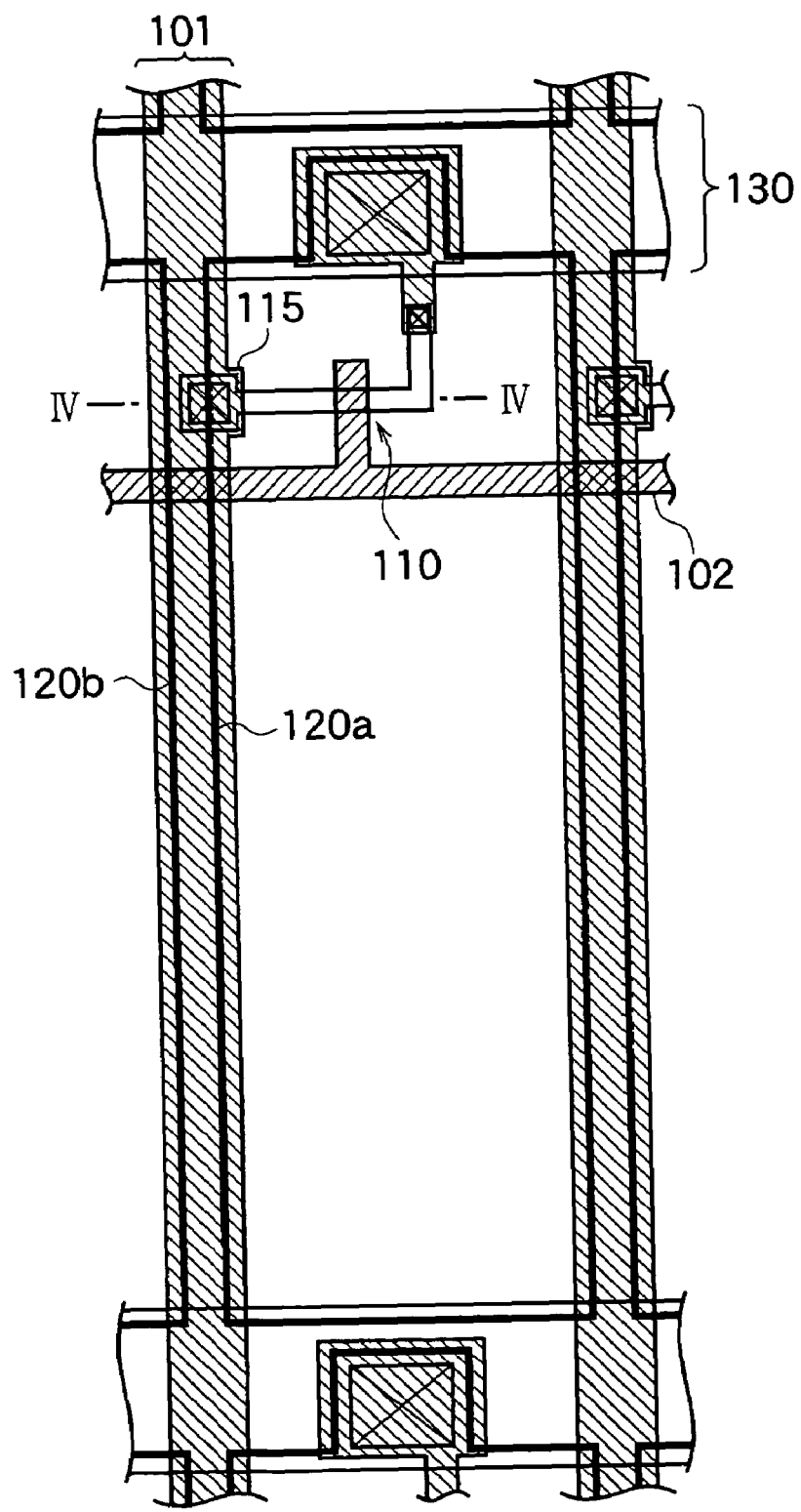
FIG. 8 is a plan view showing a schematic configuration of each pixel in a liquid crystal display device according to a second embodiment.
Figure 9:
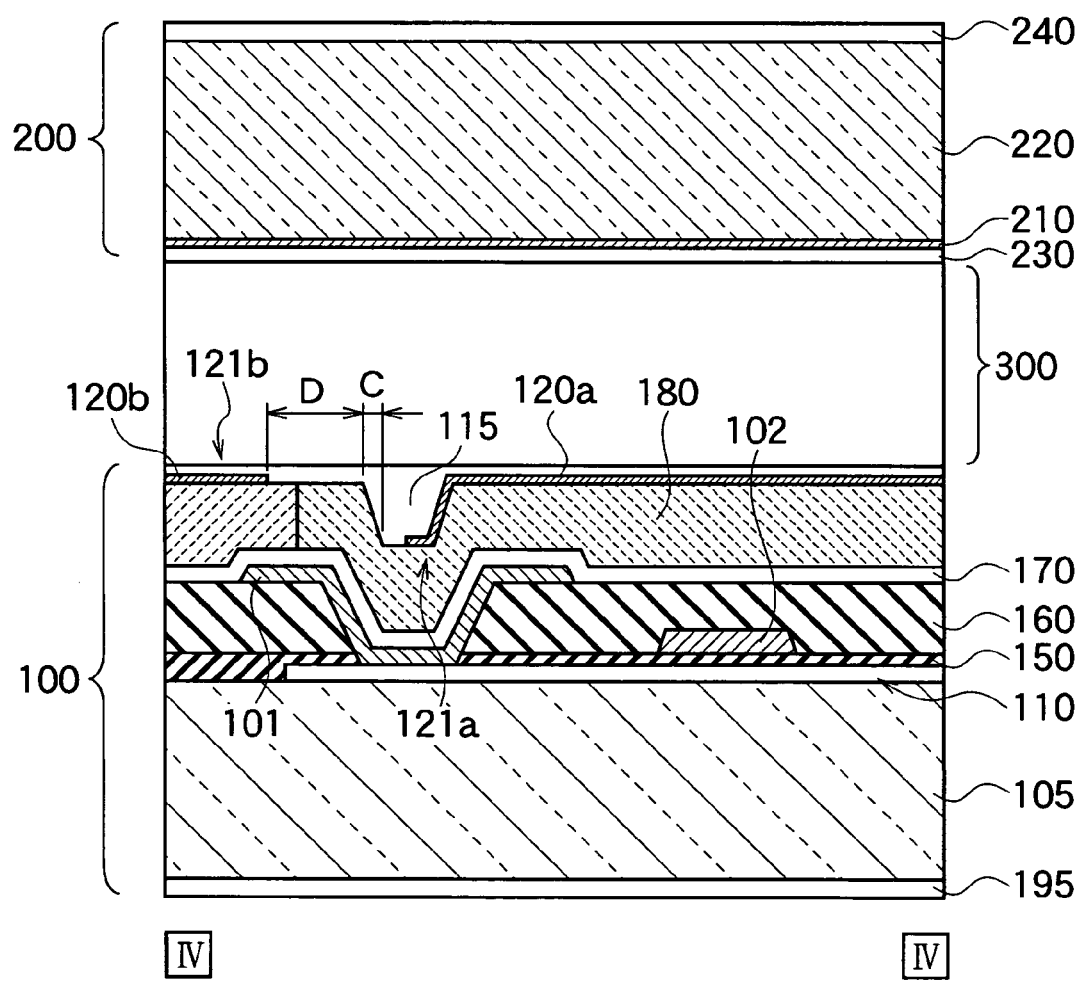
FIG. 9 is a cross-sectional view showing the schematic configuration, which is taken along the IV—IV line in FIG. 8.

As shown in FIG. 8, in this embodiment, part of the contact hole 115 is disposed so as to overlap the end of the pixel electrode 120a. FIG. 9 shows an example of forming the end 121a of the pixel electrode 120a so as to reach a bottom of the recess of the contact hole 115. However, it is also possible to form the end 121a of the pixel electrode 120a so as to reach a tapered portion. In the meantime, assuming a horizontal dimension of the tapered portion of the contact hole 115 as C, the end 121b of the adjacent pixel electrode 120b is formed in a position away from an aperture edge of the contact hole 115 by a dimension D, which is not less than the dimension C. For the rest, elements equivalent to those illustrated in FIG. 6 and FIG. 7 are denoted by the same reference numerals and duplicate explanations will be omitted herein.

According to this embodiment, the end 121a of the pixel electrode 120a is disposed in the position overlapping part of the contact hole 115, and the end 121b of the pixel electrode 120b is formed in the position which is distant from the aperture edge of the contact hole 115 by the dimension D. In this way, even if the positions of the pixel electrodes 120 are shifted due to manufacturing errors when forming the pixel electrodes, it is possible to prevent the respective ends 121a and 121b of the adjacent pixel electrodes 120a and 120b from constituting a short circuit attributable to an electrode material remaining at the bottom of the contract hole 115.

Moreover, according to the present invention, the contact hole 115 is disposed in the position shifted to the signal line 101 side as compared to FIG. 6. Therefore, it is possible to increase an aperture ratio of the pixel electrode 120a more than the first embodiment.

Third Embodiment

Figure 10:
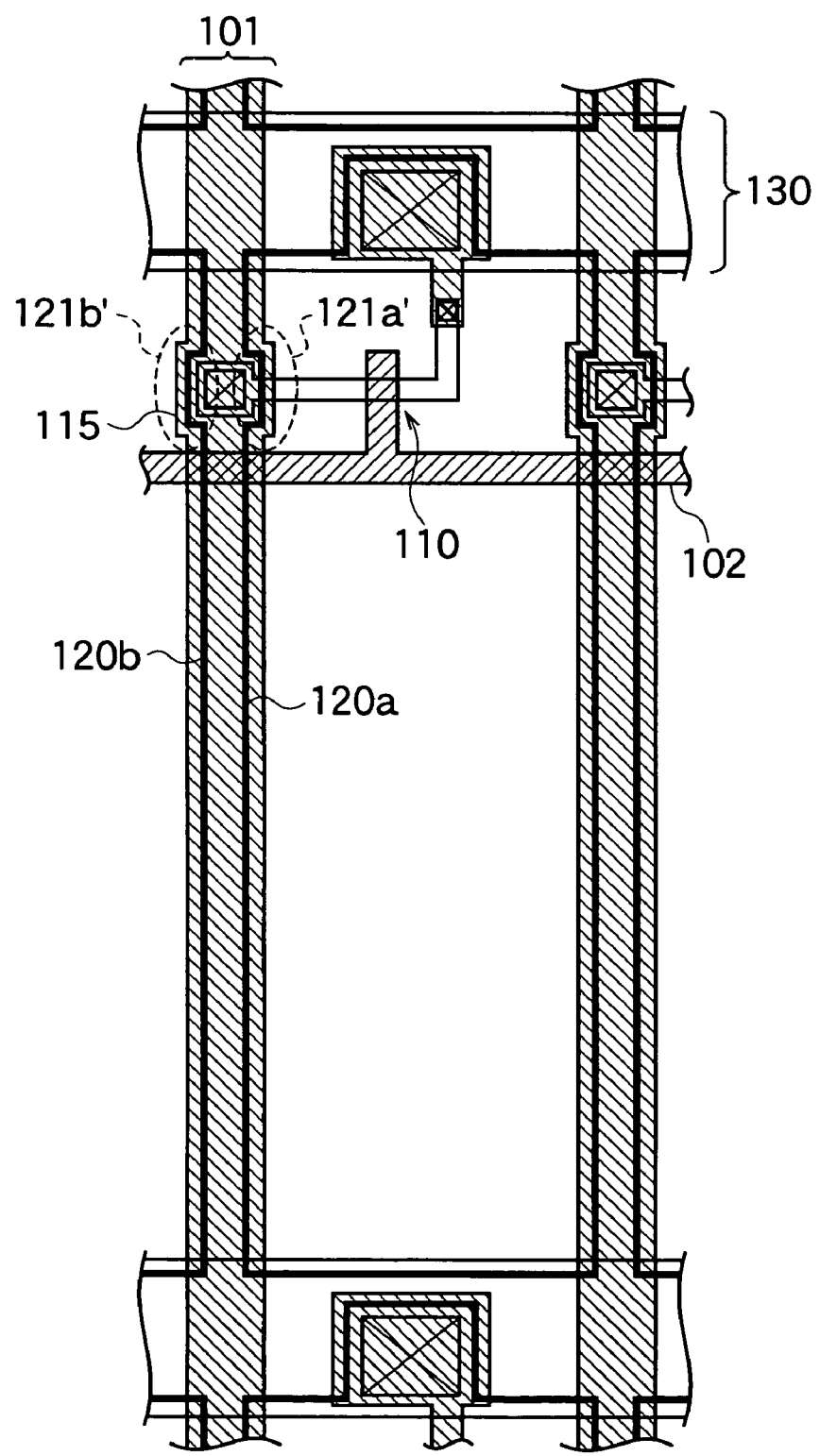
FIG. 10 is a plan view showing a schematic configuration of each pixel in a liquid crystal display device according to a third embodiment.

As shown in FIG. 10, in this embodiment, the contact hole 115 is disposed in the position overlapping the signal line 101 as similar to FIG. 1. Moreover, respective ends 121a' and 121b' of the pixel electrodes 120a and 120b, which are adjacent to each other while interposing the signal line 101, are formed in positions distant from the aperture edges of the contact hole 115 by the dimension D (>C). Here, although the dimensions D and C are not indicated in FIG. 10, these dimensions refers to the same dimensions described in the second embodiment by use of FIG. 9. For the rest, elements equivalent to those illustrated in FIG. 6 are denoted by the same reference numerals and duplicate explanations will be omitted herein.

According to this embodiment, although the contact hole 115 is formed in the position overlapping the signal line 101, the respective ends 121a' and 121b' of the adjacent pixel electrodes 120a and 120b are formed in the positions distant from the aperture edges of the contact hole 115 by the dimension D. In this way, even if the positions of the pixel electrodes 120 are shifted due to manufacturing errors when forming the pixel electrodes, it is possible to prevent the respective ends 121a' and 121b' of the adjacent pixel electrodes 120a and 120b from constituting a short circuit attributable to an electrode material remaining at the recess of the contract hole 115.

As described above, according to the electrode substrate for a display device according to each of the embodiments, it is possible to prevent a short circuit of the adjacent pixel electrodes when forming the pixel electrode without suffering the influence of the electrode material remaining in the recess of the contact hole. In this way, it is possible to reduce occurrence of defective pixels.

Therefore, it is possible to fabricate liquid crystal display devices at high yields by applying the electrode substrates of the present invention to the array substrates in the liquid crystal display devices.

What is claimed is:

1. An electrode substrate for a display device comprising:
   a plurality of scan lines and a plurality of signal lines which are disposed so as to intersect one another;
   a plurality of pixel electrodes disposed at respective intersections;
   switching elements provided at the respective intersections, each of the switching elements being configured to allow conduction between the signal line and the pixel electrode by an instruction of a gate signal to be supplied to the scan line and thereby to write a video signal supplied to the signal line into the pixel electrode;
   a protection film formed between the signal line and the pixel electrode; and
   contact holes configured to connect the signal line and one electrode of the switching element,
   wherein each of the signal lines is formed so as to cover a gap between two pixel electrodes being adjacent in a direction of the scan line, the contact holes cause recesses on the protection film, an end of only one of the two pixel electrodes which are adjacent to each other while interposing the signal line is provided in a position extending into without extending beyond the recess on the protection film caused by the contact hole, and an end of the other one of the two pixel electrodes is distant from an aperture edge of the contact hole by a longer dimension than a horizontal dimension of a tapered portion of the contact hole.

* * * * *